United States Patent [19]

Fucili et al.

[11] Patent Number: 5,422,923
[45] Date of Patent: Jun. 6, 1995

[54] PROGRAMMABLE TIME-INTERVAL GENERATOR

[75] Inventors: Giona Fucili, Magenta; Maurizio Nessi, Como, both of Italy

[73] Assignee: SGS-Thomson Microelectronics s.r.l., Milan, Italy

[21] Appl. No.: 222,253

[22] Filed: Mar. 31, 1994

[51] Int. Cl.⁶ .................... H03K 21/00; H03K 5/13
[52] U.S. Cl. .......................... 377/26; 377/20; 377/44; 377/49; 327/279
[58] Field of Search ............ 377/20, 44, 26, 49, 377/39; 327/265, 279, 286

[56] References Cited

U.S. PATENT DOCUMENTS

| | | | |
|---|---|---|---|
| 3,824,378 | 7/1974 | Johnson et al. | 377/44 |
| 4,371,940 | 2/1983 | Yamaki et al. | 377/20 |
| 4,809,221 | 2/1989 | Magliocco et al. | 377/44 |
| 5,142,651 | 8/1992 | Cronyn | 377/26 |

FOREIGN PATENT DOCUMENTS 0208049 1/1987 European Pat. Off. ........ H03K 5/13
2200774 8/1988 United Kingdom ........ H03K 21/00

OTHER PUBLICATIONS

Ogasawara et al., "An Approach to Position Sensorless Drive for Brushless dc Motors," *IEEE Transactions on Industry Applications* 27(5):928–933, 1991.

*Primary Examiner*—John S. Heyman
*Attorney, Agent, or Firm*—Seed and Berry

[57] ABSTRACT

A programmable time-intervals generator comprising first and second digital counters, a memory, a digital divider and a digital adder. On the occurrence of a first event, the first counter starts counting, and on the occurrence of a second event, only the most significant bits of the number counted up to then are stored, thereby providing a division by truncation. From the stored number, at least two discrete fractions are obtained by the divider, whereafter said fractions are summed at the adder which operates on strings of bits. The second counter counts down the sum number and, on becoming cleared, generates a signal.

9 Claims, 1 Drawing Sheet

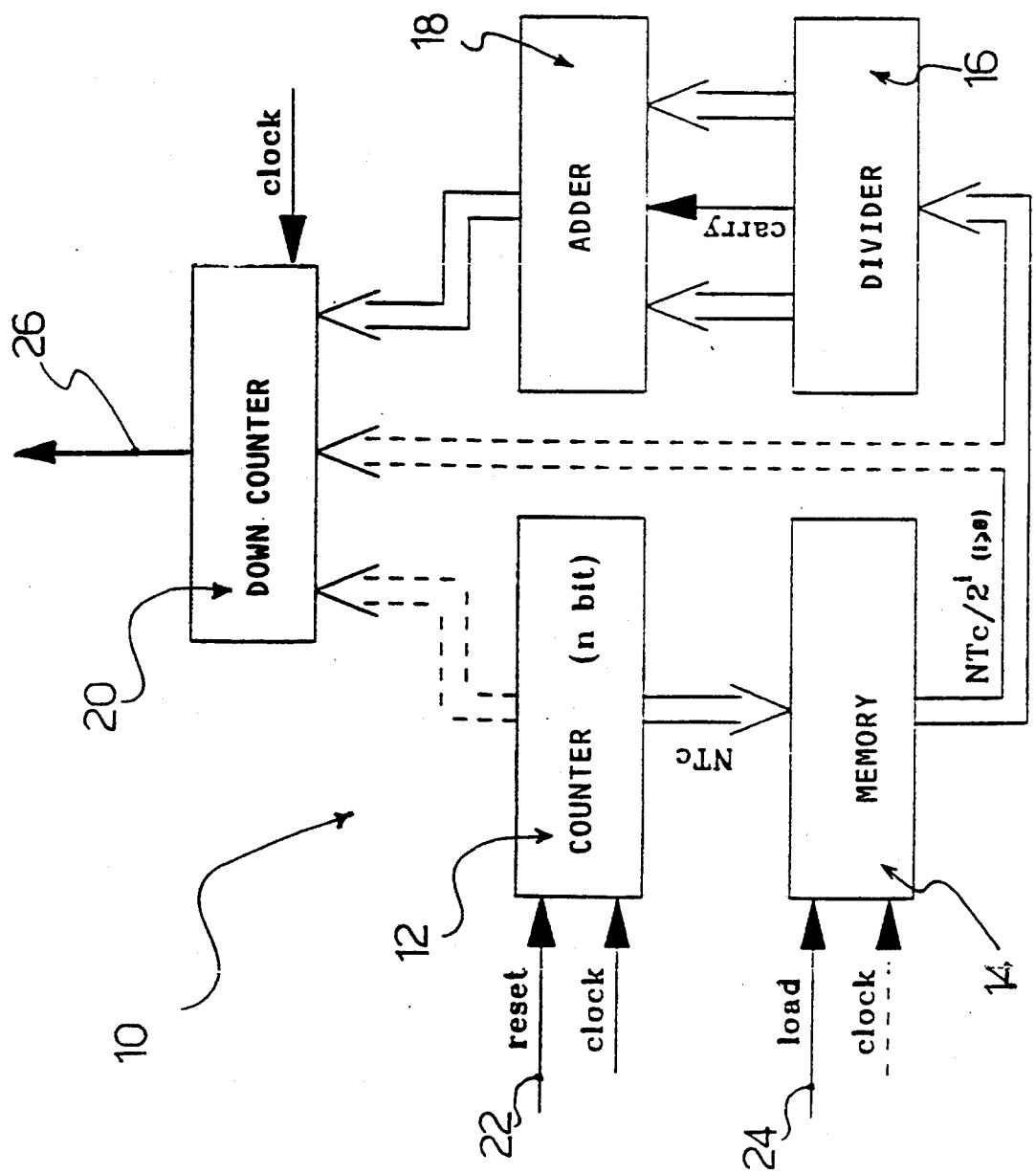

PROGRAMMABLE TIME-INTERVAL GENERATOR

TECHNICAL FIELD

This invention relates to time-intervals generator devices, in particular to programmable generators of the digital type suitable for monolithic integration.

BACKGROUND OF THE INVENTION

Programmable time-intervals generators are useful in a variety of applications, e.g. to generate delays in digital systems for DC controlling three-phase brushless motors incorporating no position sensors, referred to in the pertinent technical literature as DC brushless sensorless motors. Alternatively, generators of this kind may be used to directly generate signal-timing signals at predetermined time spacings, or control signals.

In all cases, time intervals ought to be generated with programmable duration, from a basic time interval (i.e. a counted coded number for clock periods) which separates two discrete events that may be of the same type.

In conventional time-intervals generation systems of the digital type, the time interval between two events is divided into a predetermined number of identical time subintervals, and in order to arrive at the programmed time spacing, the duration of one such time subinterval is multiplied a predetermined number of times.

It has been common practice to use for this operation a digital counter with base 2, e.g. sixteen-bit, which is cleared on the occurrence of an event and begins counting at a rate which is set by a clock signal.

A second event, which may obviously be of the same type as the first, will enable a memory to store some of the most significant bits of the coded number by the counter, e.g. the first eleven bits, thereby performing a truncation operation, in this case on the least significant five bits, which is the equivalent of dividing the counted number. Specifically in this example, the division is by 2 to a power of 5, namely by 32.

A decremental counter or down-counter then begins to count down the resultant coded number, and an additional counter is programmed to count the number of times that the down-counter must count the coded number. Thus, a time interval is obtained which is equal to the coded number count time multiplied a predetermined number of times.

However, this scheme has a drawback which may become serious in certain applications.

To improve the programmability of the actual durations of the time spacings generated and their accuracy, the time interval must be divided between the two control events into increasingly "finer", and hence more numerous, subintervals.

The consequent overall error, however, may even exceed in some cases that brought about by a coarser subdivision.

In fact, the subdivision of the interval between the two events is performed in a coded mode by truncation of a number, and the resultant error is, therefore, multiplied by the number of times that the subinterval thus obtained is repeated to arrive at the programmed time interval.

SUMMARY OF THE INVENTION

One object of the present invention is to provide a programmable digital generator of time intervals which can ensure higher accuracy than current conventional digital generators.

According to principles underlying this invention, a programmable counter arrives at the time interval sought, from the basic time interval, by summing together the smallest number of fractions of the coded number counted during that time interval, that is using fractions with different values to start from the largest.

In this way, the error due to truncations can be minimized.

Using digital counting arrangements which adopt truncation of the least significant bits for fractioning the coded number which has been counted during the basic time interval between two events, the fractioning is only performed by powers of the selected base for coding.

With a binary system, there can only be divisions by:

$$2^1, 2^2, \ldots 2^n.$$

The programmable digital generator of time intervals according to the invention is defined and characterized in the claims appended to this specification.

The features and advantages of a time interval generator according to the invention will become apparent from the following description of an embodiment thereof, given by way of example and not of limitation with reference to the accompanying drawing.

BRIEF DESCRIPTION OF THE DRAWING

The single FIGURE shows a programmable digital generator of time intervals according to the invention, in block diagram form.

DETAILED DESCRIPTION OF THE PRESENT INVENTION

The block diagram of the programmable time-interval generator 10 shown in the drawing figure includes a first digital counter 12, preferably an up-counting counter, a memory 14, a digital divider 16 and a digital adder 18, and a second digital counter 20, preferably of the down-counting type, which are interconnected by means of terminals or other appropriate electrical interconnect lines for the transmission of bits, in a parallel, or optionally serial, mode. The term "bits" as used herein includes digits or other electronic information signals.

The connections are symbolically shown in the drawing and may, of course, include one or more conductive lines. The control terminals specified therein are the basic ones useful for the generator operation, programmability and control. Other conductive lines, control terminals or clock signal inputs can be added to those shown if desired.

The up-counter 12 is controlled through a reset terminal 22 which controls the counter to clear it up and start counting on the occurrence of a first event.

On the occurrence of a second event, which may be of the same type or a different type as the first event, the output NTc of the counter 12 is provided to the memory and the memory is enabled by a load terminal 24 to store, starting with the most significant bits, at least some, but not all of the bits of the coded number NTc which has been counted up to at that time by the counter.

The system is timed and incremented by clock signals, either generated internally of the system or supplied thereto through a specially provided input terminal. The circuitry supplying such clock signals has been omitted from the drawing figures because the generation and supplying of clock signals can be accomplished by any means well known in the art and one of skill in that art would know how to provide suitable clock signals.

Importantly, this same system architecture may also be used with other bases than those used for the binary digital coding, e.g., bases 3 or 10.

The storage of only some, but not all of the predetermined bits, starting with the most significant ones, results in the coded number counted during the time interval between the first event and the second, to which there corresponds a predetermined number of periods of the system clock signal, being divided by truncation. The number stored by the memory is thus $NTc/2^i$ where i is greater than 0.

The coded number $NTc/2^i$ thus stored is transmitted to the divider 16, which will act on the bits of that number to generate two strings, having the same numbers of bits, which are coded fractions of the stored number.

These two new coded numbers are, therefore, fractions of the fraction of the input number counted by the counter, and are summed together at the digital adder operating on bit strings.

The coded number, being the sum of the fractions from the divider 16, is then input to the down-counter 20 and counted by the down-counter 20 down to zero, at which value the down-counter 20 will output a signal on output line 26.

Thus, a time interval is obtained from the time interval between two events, whose duration can be readily programmed by setting the divisor in the divider 16 which, as is well known to those skilled in this art, may be accomplished by setting switches that are provided on a set of switches connected to the divider.

In fact, a different partition of output divisions will suffice to obtain then a sum of different fraction combinations.

A binary number with a negative intended value in the "radix complement" representation can also be obtained conventionally through the divider.

In the diagram shown, dash lines denote possible direct connections between the up-counter 12 and the down-counter 20, and between the memory 14 and the down-counter 20 either or both of which are provided in an alternative embodiment. Using these connections, the down-counter 20 can also "count" a time interval equal either to the time interval which separates the two events or to the first fraction thereof. Understandably, a selection circuitry, not shown, can be provided if desired for establishing the count sequence, it being possible for the counts to be repeated several times to provide long time intervals.

That selection circuitry may comprise simple switches incorporated to the counter. Such selection circuitry for counters is unknown to those of skill in the art.

The divider 16 is shown in the drawing to only have two outputs, and is designed, therefore, to only provide two discrete fractions of the stored number, which fractions would be obtained by means of two discrete truncations; however, it could be designed to output three or more discrete fractions and thus supply the adder with more than two addends.

It should be noted, however, that the more numerous the fractions obtained by truncation, the larger becomes the overall error due to the truncation operations and, hence, the smaller is the advantage afforded over conventional delay generators. It is for this reason that, in accordance with the principle of this invention, the direct connection between the memory 14 and the down-counter 20 has been additionally provided to set, where desired, the major aliquot of the time interval.

Of course, standard control and programming circuitry can be provided to handle the entire programming procedure, whereby the desired time intervals can be set through the counters, the memory and the divider. Any person of skill in the art would be enabled to provide counters and dividers having the standard control circuitry that can perform this function.

Viewed more generally, a time-intervals generator according to the invention is a synchronous finite state machine, specifically a Moore's machine, wherein all the system errors can be recovered, as is well known to the skilled ones.

According to principles of the present invention, all the components of the programmable time interval generator 10 are fabricated on a single integrated circuit using standard fabrication techniques known in the semiconductor art. A single monolith chip thus provides a reliable, improved programmable time interval generator. The standard connections to control circuitry and the access to individual circuits of this invention for programming the time-interval generator are provided in a manner known in the art for such individual elements. Even though the individual circuit elements are known, they have not previously been connected as taught and claimed herein to provide a reliable, programmable time-interval generator or perform a method of operation in the claimed manner.

While various embodiments of the invention have been described and illustrated, changes and modifications may be made thereunto within the scope of the same inventive concept.

As examples, the divider/adder pair could be replaced with a chain of divider/adder pairs, thereby to allow finer programming of the desired time interval.

Furthermore, the counters 12 and 20 may be made to count up or down by varying the count techniques. Also, the adder 18 may be omitted where no difference operation is anticipated between the numbers generated by the divider.

We claim:

1. A programmable time-intervals generator comprising:
    a first digital counter having at least one control terminal and at least one output terminal;
    a memory having at least one control terminal, at least one input terminal connected to the output terminal of the first counter, and at least one output terminal;
    a second digital counter having at least one input terminal and at least one output terminal;
    an operation block connected between said memory output terminal and said input terminal of the second counter, said operation block including a digital divider having at least one input terminal and at least two output terminals.

2. A programmable time-intervals generator according to claim 1, characterized in that said operation block includes a digital adder having at least two input terminals connected to the output terminals of the divider, and at least one output terminal being an output terminal of the operation block, with said input terminal of the divider being an input terminal of the operation block.

3. A programmable time-intervals generator according to claim 1 wherein the memory is coupled to the second counter by at least one connection line.

4. A programmable time-intervals generator according to claim 1 wherein the first counter is coupled to the second counter by at least one connection line.

5. A programmable time-intervals generator according to claim 1 wherein the digital divider operates on a smaller number of bits than the first counter.

6. A programmable time-intervals generator according to claim 1 wherein the digital divider has at least one control terminal.

7. A programmable time-intervals generator according to claim 6, characterized in that the divide operations of the digital divider can be programmed through said control terminal.

8. A method for generating time intervals, comprising a count operation for counting basic time intervals with predetermined durations between two events being separate in time, characterized in that it comprises at least a first divide operation for dividing the counted number of basic time intervals by a power of a predetermined number, and a second divide operation for dividing the resultant number from the first divide operation by at least two powers of said predetermined number, and a count operation for counting a number of basic time intervals with predetermined durations equal to the sum of the resultant numbers from said second divide operation.

9. A method according to claim 8, wherein the operations are carried out using digital methods, characterized in that all the divide operations are performed by truncation of strings of bits.

* * * * *